US006720249B1

(12) United States Patent
Dalton et al.

(10) Patent No.: US 6,720,249 B1
(45) Date of Patent: Apr. 13, 2004

(54) PROTECTIVE HARDMASK FOR PRODUCING INTERCONNECT STRUCTURES

(75) Inventors: Timothy J. Dalton, Ridgefield, CT (US); Christopher V. Jahnes, Upper Saddle River, NJ (US); Joyce C. Liu, Hopewell Junction, NY (US); Sampath Purushothaman, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/550,943

(22) Filed: Apr. 17, 2000

(51) Int. Cl.$^7$ .......................... H01L 21/4763

(52) U.S. Cl. ............... 438/624; 438/633; 438/634; 438/636; 438/637; 438/692; 438/740

(58) Field of Search ................. 438/624, 633, 438/634, 636, 637, 692, 740, FOR 355, FOR 111

(56) References Cited

U.S. PATENT DOCUMENTS

| | | | |
|---|---|---|---|
| 4,396,458 A | | 8/1983 | Platter et al. |
| 5,442,237 A | | 8/1995 | Hughes et al. |
| 5,472,913 A | * | 12/1995 | Havemann et al. ......... 438/702 |
| 5,552,638 A | | 9/1996 | O'Connor |
| 5,604,380 A | | 2/1997 | Nishimura et al. |
| 5,661,344 A | | 8/1997 | Havemann et al. |
| 5,880,018 A | | 3/1999 | Boeck et al. |
| 5,886,410 A | | 3/1999 | Chiang et al. |
| 5,924,005 A | | 7/1999 | Waldo |
| 5,968,842 A | * | 10/1999 | Hsiao ..................... 438/692 |
| 6,071,809 A | * | 6/2000 | Zhao ...................... 438/634 |

(List continued on next page.)

FOREIGN PATENT DOCUMENTS

| EP | 0177845 | 4/1986 |
|---|---|---|
| EP | 0680085 | 11/1995 |

OTHER PUBLICATIONS

Ghandhi, Sorab K., "VLSI Fabrication Principles", 1983 by John Wiley & Sons, Inc., p. 518.*
Cronin, J. et al. *Improved Stud Shape by Auto–Multi–Damascene Process*. IBM Technical Disclosure, vol. 32, No. 12 (May 1990) pp. 248–249.
Babich, E. et al. *Modified Polymer Outer–Layer as Etch Stop in Microelectronic Applications*, IBM Technical Disclosure, vol. 35, No. 4B (Sep. 1992) p. 87.

*Primary Examiner*—Olik Chaudhuri
*Assistant Examiner*—Michelle Estrada
(74) *Attorney, Agent, or Firm*—Jay H. Anderson; DeLio & Peterson, LLC

(57) ABSTRACT

The present invention provides a permanent protective hardmask which protects the dielectric properties of a main dielectric layer having a desirably low dielectric constant in a semiconductor device from undesirable increases in the dielectric constant, undesirable increases in current leakage, and low device yield from surface scratching during subsequent processing steps. The protective hardmask further includes a single layer or dual layer sacrificial hardmask particularly useful when interconnect structures such as via openings and/or lines are formed in the low dielectric material during the course of making the final product. The sacrificial hardmask layers and the permanent hardmask layer may be formed in a single step from a same precursor wherein process conditions are altered to provide films of differing dielectric constants. Most preferably, a dual damascene structure has a tri-layer hardmask comprising silicon carbide BLoK™, PECVD silicon nitride, and PECVD silicon dioxide, respectively, formed over a bulk low dielectric constant interlevel dielectric prior to forming the interconnect structures in the interlevel dielectric.

29 Claims, 7 Drawing Sheets

U.S. PATENT DOCUMENTS

| | | | | |
|---|---|---|---|---|
| 6,077,769 A | * | 6/2000 | Huang et al. | 438/622 |
| 6,103,616 A | * | 8/2000 | Yu et al. | 438/618 |
| 6,140,226 A | * | 10/2000 | Grill et al. | 438/637 |
| 6,184,128 B1 | * | 2/2001 | Wang et al. | 438/637 |
| 6,225,207 B1 | * | 5/2001 | Parikh | 438/622 |
| 6,265,307 B1 | * | 7/2001 | Lou | 438/618 |
| 6,309,962 B1 | * | 10/2001 | Chen et al. | 438/638 |
| 6,362,091 B1 | * | 3/2002 | Andideh et al. | 438/624 |
| 6,541,367 B1 | * | 4/2003 | Mandal | 438/622 |

* cited by examiner

PROTECTIVE HARDMASK FOR PRODUCING INTERCONNECT STRUCTURES

BACKGROUND OF THE INVENTION

1. Field of the Invention

This invention relates to a semiconductor device having an overall reduced dielectric constant and a method of producing the device utilizing a series of hardmask layers which protect an interlevel dielectric material of the device.

2. Description of Related Art

As semiconductor devices decrease in feature size, line-to-line capacitance becomes a problem. When metal lines of a semiconductor device are patterned closer and closer together, the dielectric constant k of any interlayer dielectric (ILD) material needs to be reduced in order to reduce the capacitive coupling between those lines. Thus, it is preferable to use an ILD having as low a dielectric constant as possible. However, during formation of the interconnects within the semiconductor device, even a desirably low k ILD is subject to processing conditions which may undesirably increase its dielectric constant thereby increasing the overall effective dielectric constant of the device as a whole. During removal of excess metal used to form the interconnect by chemical mechanical planarization (CMP), the CMP slurry may contaminate or deteriorate the low k ILD. During the deposition of hardmasks and caps, the deposition processes may degrade the low-k ILD.

Damascene processes are one way to provide a method of forming interconnect structures to connect the numerous layers of metallization. A typical single damascene processes is described in U.S. Pat. No. 4,944,836 issued to Beyer which is incorporated herein by reference. A dual damascene process in which conductive lines and stud via metal contacts are formed simultaneously is described in U.S. Pat. No. 4,789,648 issued to Chow which is incorporated herein by reference.

Conventional methods for depositing a low-k organosilicate (OSG) hardmask over an ILD during damascene processes utilize a reactive precursor or precursor mix such as silane ($SiH_4$), methylsilane ($CH_3SiH_3$), trimethylsilane (($CH_3)_3SiH$), or tetramethylsilane (($CH_3)_4Si$), and an oxidizer such as $N_2O$, $O_2$, $CO$, $CO_2$, or $H_2O$. However, the reactive oxygen content of the plasmas required to produce a low-k hardmask from these species is sufficient to damage bulk low-k ILD 30, to damage and degrade adhesion between a hardmask and the ILD, or to alter the cladding/passivation layers present within the pores of nanoporous materials such as Nanoglass™ (Allied Signal, Santa Clara, Calif.).

Bearing in mind the problems and deficiencies of the prior art, it is therefore an object of the present invention to provide a method of protecting a low k ILD during semiconductor processing to preserve the low overall effective dielectric constant of the resultant device.

It is another object of the present invention to provide a method of forming interconnect structures in a semiconductor device wherein the low k ILD does not suffer any undesirable increases in its dielectric constant.

A further object of the invention is to provide a semiconductor device having a low overall effective dielectric constant.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of protecting a low dielectric constant layer on a semiconductor material during processing of the material, the method comprising: providing a substrate of a semiconductor material and, optionally, an etch stop layer thereover; depositing a bulk low dielectric constant material over the semiconductor material; depositing a first hardmask layer comprising a low dielectric constant material over the bulk low dielectric constant material; depositing a sacrificial second hardmask layer disposed over the first hardmask layer; subsequently processing the semiconductor material, the hardmask layers and the bulk low dielectric constant material; and removing the second hardmask layer while permanently retaining the first hardmask layer over the bulk low dielectric constant material, wherein the first hardmask layer material protects the bulk low dielectric constant material to substantially prevent alteration of the dielectric constant thereof during subsequent processing.

Preferably, the step of depositing a first hardmask layer comprises depositing a low dielectric constant material having a dielectric constant of about 2.5–8.0, preferably 2.5–4.5. Preferably, the step of depositing the first and second hardmask layers comprises depositing silicon nitride, silicon carbide, amorphous hydrogenated silicon carbide, silicon carbide nitride, organo-silicate glass, silicon rich oxide, silicon dioxide, tetraethylorthosilicate, phosphosilicate glass, organic siloxane polymer, carbon doped silicate glass, hydrogen doped silicate glass, silsesquioxane glass, spin-on glass, or fluorinated silicate glass.

The method of this aspect may further include the step of depositing a sacrificial third hardmask layer over the sacrificial second hardmask layer, the third hardmask layer being removed during subsequent processing. Preferably, the step of subsequent processing to make interconnect structures comprises forming openings in the hardmask layers and in the bulk low dielectric material and filling such openings with a metal to make electrically conductive connections from the substrate to a region above the first hardmask layer. Chemical mechanical polishing may be used to remove excess metal within the interconnect structures wherein the bulk low dielectric constant material is protected by the first hardmask layer from an undesirable increase in its dielectric constant, an undesirable increase in leakage, and yield reduction due to scratching.

The step of depositing the first and second hardmask layers may comprise a single deposition utilizing one precursor material and altering deposition conditions to provide two films with different dielectric constants. Preferably, the current aspect may further include an embedded etch stop layer dividing the bulk low dielectric constant material into a lower portion and an upper portion. Alternatively, the embedded etch stop layer may separate a bulk low dielectric constant material comprising two different types of material.

In a second aspect, the present invention is directed to a method of forming interconnect structures comprising the steps of: providing a semiconductor substrate; depositing a bulk dielectric material over the semiconductor substrate; depositing a first hardmask layer having a dielectric constant substantially equal to a dielectric constant of the bulk dielectric material; depositing a second hardmask layer over the first hardmask layer; depositing a third hardmask layer over the second hardmask layer; etching one or more vias and/or lines through the hardmask layers and the bulk dielectric material; depositing a conductive material into the vias; removing an excess of the conductive material by chemical mechanical planarization wherein the third and second hardmask layers are simultaneously removed; and retaining the first hardmask layer.

In a third aspect, the present invention is directed to an intermediate semiconductor device wherein a bulk dielectric material is protected from undesirable alteration of its dielectric constant comprising: a substrate; a bulk dielectric material disposed thereover; a first hardmask layer having a substantially similar dielectric constant as the bulk dielectric disposed over the bulk dielectric material; and a second hardmask layer disposed over the first hardmask layer, the second hardmask layer adapted to be removed during formation of interconnect structures in the semiconductor intermediate.

The intermediate semiconductor device may further include a third hardmask layer disposed over the second hardmask layer, the third hardmask layer adapted to be removed during formation of interconnect structures in the semiconductor intermediate. Optionally, the intermediate semiconductor device may further include an etch stop layer disposed between the substrate and the bulk dielectric material and/or an embedded etch stop layer dividing the bulk dielectric material into upper and lower portions, the embedded etch stop layer adapted to provide uniform depth during subsequent etching of the bulk dielectric material.

In a fourth aspect, the present invention is directed to a semiconductor substrate having interconnect structures comprising: a substrate; a bulk dielectric material disposed over the substrate; a hardmask layer of a material having a substantially similar dielectric constant as the bulk dielectric material to protect the bulk dielectric material from undesirable changes in a dielectric constant of the bulk dielectric material during subsequent processing; and interconnect structures extending from a region above the hardmask layer through openings formed in the hardmask layer and the bulk low dielectric material to contact devices in the substrate.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS(S)

Figure 1:
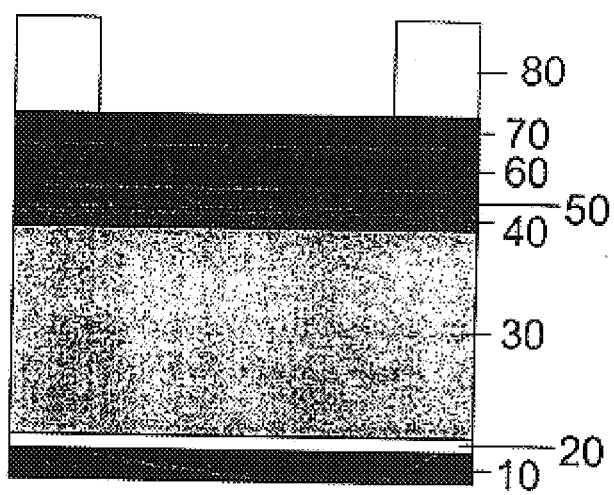
FIGS. 1–10 are cross-sectional views of a semiconductor device illustrating a method of forming interconnect structures in accordance with a first preferred embodiment of the present invention utilizing a dual damascene structure with a triple layer hardmask.

In describing the preferred embodiment of the present invention, reference will be made herein to FIGS. 1–20 of the drawings in which like numerals refer to like features of the invention. Features of the invention are not necessarily shown to scale in the drawings.

The present invention provides for a permanent protective hardmask which protects the dielectric properties of a main dielectric layer having a desirably low dielectric constant in a semiconductor device from undesirable increases in the dielectric constant during subsequent processing steps. The protective hardmask is particularly useful where interconnect structures such as via openings are formed in the low dielectric material during the course of making the final product. One of skill in the art may use the precursor flow rates and power sources disclosed herein to provide the appropriate process conditions for forming interconnect structures in accordance with the present invention.

A first embodiment of the present invention is depicted in FIGS. 1–10 comprising a dual damascene structure having a triple layer hardmask. A silicon semiconductor substrate 10 has deposited thereover an etch stop layer 20 comprising, for example, amorphous hydrogenated silicon carbide preferably that sold under the tradename BLoK™ by Applied Materials of Santa Clara, Calif. The thickness of etch stop layer 20 is preferably from about 10–100 nm, with a thickness of 50 nm being more preferred. Etch stop layer 20 ideally has the combined properties of not only being an etch stop layer but also a diffusion barrier to subsequent interconnect materials such as copper.

Etch stop layer 20 may also include such materials as silicon nitride, silicon carbide nitride, organo-silicate glass (OSG), silicon rich oxide (SiRO), silicon dioxide, organic siloxane polymer, carbon or hydrogen doped silicate glass or silsesquioxane glass, spin-on glass, fluorinated or non-fluorinated silicate glass, or any material know in the art to be a useful etch stop material. Over substrate 10 and etch stop layer 20 there is deposited a bulk low dielectric constant interlevel dielectric material (bulk low-k ILD) 30 in a preferred thickness of about 100–2000 nm. Bulk low-k ILD 30 is preferably an organic spin-on polymer sold under the tradename SiLK™ by Dow Chemical of Midland, Mich. having a preferred thickness of about 700 nm. Additionally, bulk low-k ILD 30 may comprise any of the following: silicon dioxide, polyimide, organic siloxane polymer, polyarylene ether, carbon-or hydrogen-doped silicate glass or silsesquioxane glass, spin-on glass, fluorinated or non-fluorinated silicate glass, diamond like amorphous carbon, nano-porous silicate or organosilicate glass or silsesquioxane polymer, or any similar low dielectric constant material known in the art to be a useful dielectric material.

Thereafter, a first hardmask layer 40 comprising a low dielectric constant material is deposited over the bulk low-k ILD 30. This first hardmask layer may be deposited in a thickness in the range of about 10–200 nm, but less than the thickness of the bulk low-k ILD 30. A preferable first hardmask layer is amorphous-hydrogenated silicon carbide sold under the tradename BLoK™ in a thickness of about 50 nm. A second preferred material (with a lower dielectric constant then the BloK™ material) for the first hardmask layer is an organosilicate glass (OSG) with an acronym based upon its chemical composition—SiCOH with a thickness of about 50 nm. The SiCOH films for this application can be deposited over a large range of deposition conditions and can also be synthesized with different precursors such as Tetramethylcyclotetrasiloxane ($Si_4C_4O_4H_{16}$) (TMCTS) and Octamethylcyclotetrasiloxane ($Si_4C_8O_4H_{24}$) (OMCTS). For the precursor choice the important factors are that the molecule contain all the elements of the film and that it can be vaporized into a gas for processing within a Plasma Enhanced Chemical Vapor Deposition system (PECVD). The preferred precursor is TMCTS as it fulfills the requirements above and is also easily fragmented at low RF powers thereby minimizing the formation of oxygen radicals or ions during the PECVD process. PECVD depositions have been proven in two tool configurations: wafer on RF powered electrode and wafer on grounded electrode. Both of these configurations are capable of producing SiCOH films with similar film properties. From these two sets of tool configurations acceptable process conditions have been generated. The precursor type can be any gaseous molecule containing Si—C—O—H, but is preferably TMCTS. Precursor flow ranges from 30 to 750 sccm, but is preferably 100 to 500 sccm. The deposition pressure is from 100 mTorr to 5000 mTorr, and preferably between 500 to 3000 mTorr. The deposition temperature ranges from about 25° C. to 450° C., but is preferably about 100° C. to 400° C. The applied RF power range is about 5 W to 400 W.

A second hardmask layer 50 in a thickness of about 10–200 nm is then deposited, preferably comprising a PECVD silicon nitride in a thickness of about 35 nm. A third hardmask layer 60 having a thickness of about 10–200 nm is then deposited, preferably comprising a PECVD silicon dioxide layer of a thickness of about 150 nm. Additionally, hardmask layers 40, 50 and 60 may comprise PECVD silicon nitride, silicon carbide, amorphous-hydrogenated silicon carbide, silicon carbide nitride, OSG, silicon dioxide, organic siloxane polymer, carbon-or hydrogen-doped silicate glass or silsesquioxane glass, spin-on glass (SOG), fluorinated or nonfluorinated silicate glass.

Figure 2:
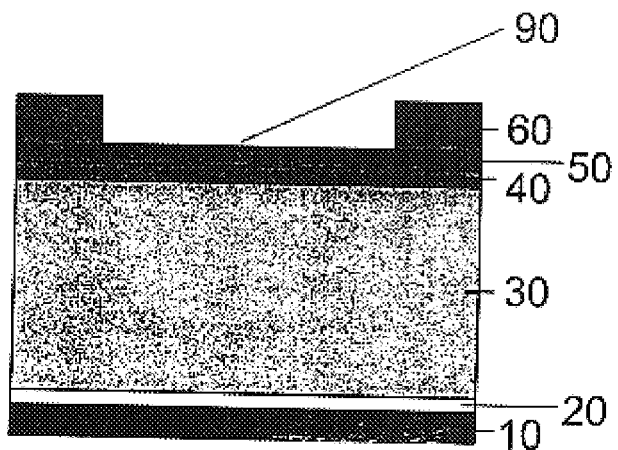

An optional anti-reflective coating (ARC) 70 in the range of about 10–200 nm, preferably about 90 nm may be deposited over the hardmask layers. A photoresist layer 80 in a thickness of about 200–1000 nm, preferably about 500 nm, is then deposited, patterned, and etched with a line-level pattern of the layer to be printed. The image from photoresist layer 80 is then transferred onto anti-reflective coating layer 70 and then into the third hardmask layer 60 using a conventional plasma etching process. The photoresist layer 80 and anti-reflective coating layer 70 are then removed leaving a patterned third hardmask layer 60, as shown in FIG. 2. Preferably, the third hardmask layer is etched in a plasma etcher sold by Lam Research Corp. of Fremont, Calif., model 4520XL, using a mixture of 0–500 standard cubic centimeters per minute (sccm) Ar, 0–500 sccm CO, 1–20 sccm $C_4F_8$, and 0–20 sccm $O_2$, with a high-frequency power between 0–2000 Watts and a low-frequency power between 0–2000 Watts at a pressure between about 10–1000 mTorr. The photoresist is removed using $O_2$ at a flow rate of 1–1000 sccm with high and low-frequency powers between 0–2000 Watts at a pressure of about 10–1000 mTorr. The conditions of the plasma etching of the third hardmask layer are selected such that the second hardmask layer 50 is not etched and likewise the second hardmask material is selected so that it is not adversely affected by the photoresist removal process employed after forming pattern 90. The second hardmask layer 50 protects low dielectric first hardmask layer 40 from exposure to one of the aforementioned processes, i.e., the hardmask image transfer and the photoresist strip process, both of which can damage the first hardmask layer and increase its dielectric constant in an undesirable fashion.

Figure 3:
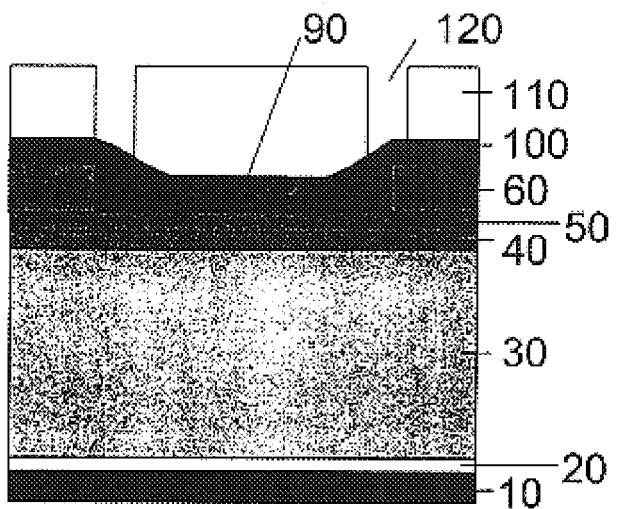
Figure 4:
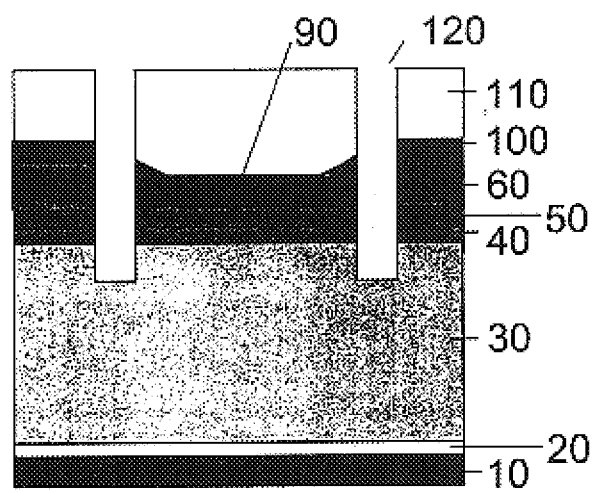

As shown in FIG. 3, after forming the image 90 of the line-layer in the third hardmask layer 60, the via-level photolithography is then completed, which comprises depositing an anti-reflective coating layer 100 having a thickness of about 10–200 nm, preferably about 90 nm, and a photoresist layer 110 having a thickness of about 200–1000 nm, preferably about 500 nm. An image 120 is formed in photoresist layer 110, but does not have to be completely aligned to image 90. FIG. 4 depicts the transfer of image 120 in photoresist layer 110 through anti-reflective coating layer 100, the third, second and first hardmask layers 60, 50, 40, and into the bulk low-k ILD 30, using conventional plasma etching processes. Preferably the plasma etching is accomplished in a plasma etcher model IPS sold by Applied Materials Corp. of Santa Clara, Calif. The anti-reflective coating 100 is etched using 0–500 sccm Ar, 0–20 sccm $C_4F_8$, 0–100 sccm $C_2F_6$, 0–100 sccm $CHF_3$, 0–100 sccm $CF_4$, 0–100 sccm $O_2$, 0–100 sccm $N_2$, 0–100 sccm CO, 0–100 sccm $CO_2$ with an inner power source at 0–1000 Watts, and outer power source at 400–2500 Watts, biased at 0–1400 Watts at a pressure of about 1–100 mTorr. Hardmask layers 40, 50 and 60 and bulk low dielectric material 30 are etched under the following conditions: 0–500 sccm Ar, 0–20 sccm $C_4F_8$, 0–100 sccm $C_2F_6$, 0–100 sccm $CHF_3$, 0–100 $CF_4$, 0–100 sccm $O_2$, 0–100 sccm $N_2$, 0–100 CO, 0–100 sccm $CO_2$ with an inner power source set to 0–1000 Watts, an outer power source at 400–2500 Watts, biased at 0–1400 Watts at a pressure of about 1–100 mTorr.

It should be noted that in the case where image 120 is not aligned with image 90, the conditions are chosen such that image 120 is transferred through all of the three hardmask layers 60, 50 and 40. This ensures the correct fidelity of the image transfer, and prevents an image of too small a size from being transferred.

Figure 5:
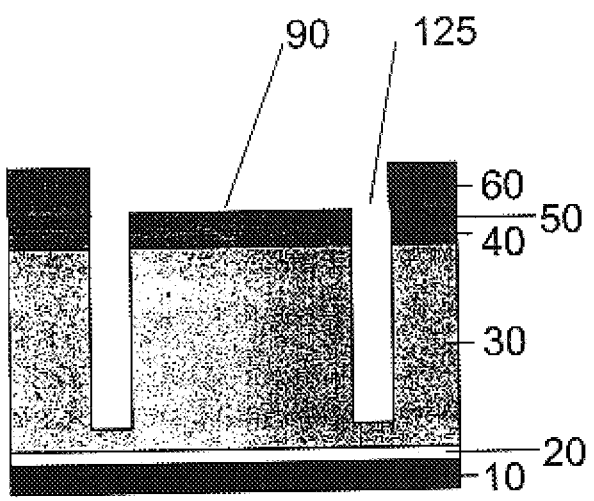

FIG. 5 illustrates the transfer of image 120 in photoresist layer 110 into the bulk low-k ILD 30 to form via 125. Simultaneously, photoresist 110 and anti-reflective coating layer 100 are etched during via formation. Via formation may be accomplished in a plasma etcher sold by Applied Materials Corp. under the following conditions: 0–500 sccm Ar, 0–100 sccm $O_2$, 0–100 sccm $N_2$, 0–100 sccm CO, 0–100 $CO_2$, 0–50 sccm $C_2H_4$, 0–50 sccm $C_2H_2$ with an inner source set at 0–1000 Watts, outer source at 400–2500 Watts, biased at 0–1400 Watts at a pressure of about 1–100 mTorr. Such conditions are chosen such that hardmask layer 60, 50 and 40 are not removed during the pattern transfer. It should be noted that the formation of via 125 in interlevel dielectric layer 30 does not proceed all the way down to etch stop layer 20 and instead stops at a predetermined desirable distance.

Figure 6:
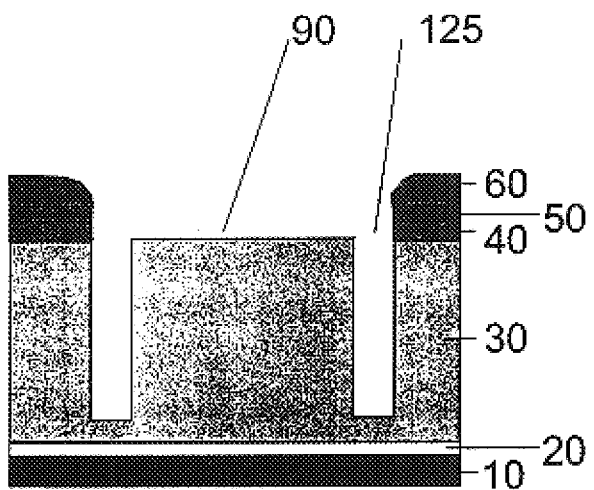

In FIG. 6, line level image 90 is transferred through the first and second hardmasks 40, 50 utilizing conventional plasma etching processes. Such plasma etching may be accomplished by an Applied Materials Corp. model IPS plasma etcher under the following conditions: 0–500 sccm Ar, 0–20 sccm $C_4F_8$, 0–100 sccm $C_2F_6$, 0–100 sccm $CHF_3$, 0–100 sccm $CF_4$, 0–100 sccm $O_2$, 0–100 sccm $N_2$, 0–100 sccm CO, 0–100 sccm $CO_2$, 0–100 sccm $CH_3F$ with an inner source set at 0–1000 Watts. Such conditions are chosen to minimize the etching the third hardmask layer 60 outside of the line-level image area, and of bulk low-k ILD 30.

Figure 7:
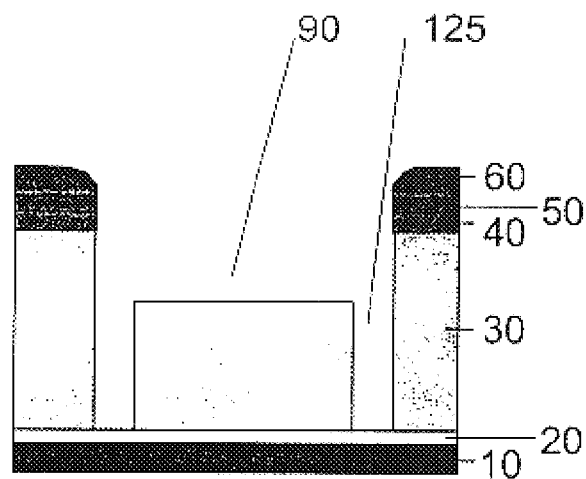

Subsequently the line level image 90 is then transferred into the bulk low-k ILD 30 as shown in FIG. 7. Simultaneously, via 125 is transferred deeper into bulk low-k ILD 30 until it reaches etch stop layer 20. Etching of bulk low-k ILD 30 is accomplished under conditions which minimize etching of third hardmask layer 60 and etch stop layer 20. For example, the following conditions are preferred when using the model IPS plasma etcher from Applied Materials: 0–500 sccm Ar, 0–100 sccm $O_2$, 0–100 sccm $N_2$, 0–100 sccm CO, 0–100 sccm $CO_2$, 0–50 sccm $C_2H_4$, 0–50 sccm $C_2H_2$ with an inner source at 0–1000 Watts, an outer source at 400–2500 Watts, biased at 0–1400 Watts at a pressure of about 1–100 mTorr.

Figure 8:
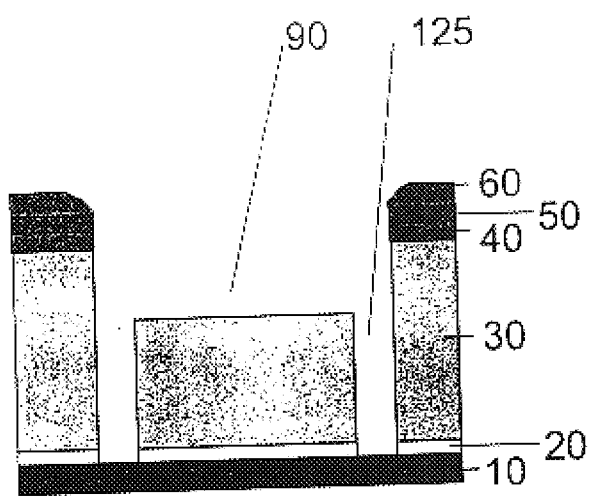

Via 125 is thereafter transferred through the etch stop layer 20 as shown in FIG. 8, to contact an underlying structure on substrate 10. This is done by conventional plasma etching under the following conditions: 0–500 sccm Ar, 0–20 sccm $C_4F_8$, 0–100 sccm $C_2F_6$, 0–100 sccm $CHF_3$, 0–100 sccm $CF_4$, 0–100 sccm $O_2$, 0–100 sccm $N_2$, 0–100 sccm CO, 0–100 sccm $CO_2$, 0–100 sccm $CH_3F$ with an inner source set at 0–1000 Watts, an outer source set at 400–2500 Watts, biased at 0–1400 Watts at a pressure of about 1–100 mTorr. Such conditions are chosen to minimize again the etching of third hardmask layer 60 and of bulk low-k ILD 30. Following this etch step, a clean process is performed which may be a dry (plasma) clean process, wet clean process or a combination of both. The dry clean process can be performed in a model MxP plasma etcher available from Applied Materials Corp. under the following conditions: 0–500 sccm Ar, 0–1000 sccm $H_2$, 0–1000 sccm $NH_3$, 0–1000 sccm $N_2$, 0–1000 sccm $N_2H_2$, 0–1000 sccm $O_2$, 0–1000 sccm CO, 0–1000 sccm $CO_2$ at an RF power of 0–1000 Watts within a magnetic field of 0–140 gauss at a pressure of about 10–1000 mTorr. Wet cleaning may be accomplished using solvent EKC525Cu sold by EKC Technologies of Fremont, Calif. according to known methods in the art.

Figure 9:
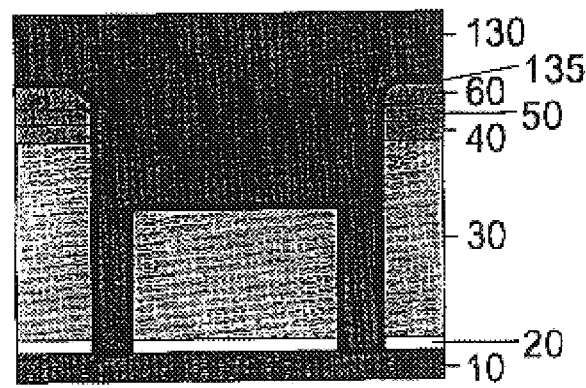
Figure 10:
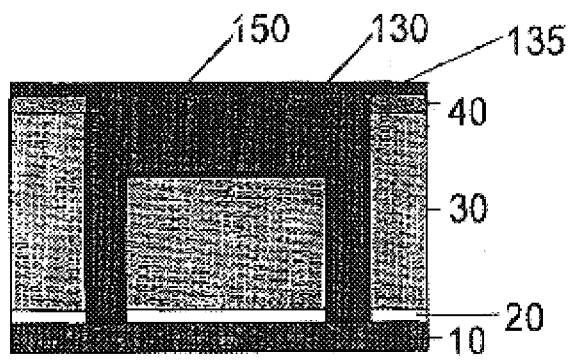

FIG. 9 illustrates metallization of the structure by depositing a metal 130 into the previously etched openings. Prior to metallization, a liner 135 material may be deposited into via 125 and line 90. The liner may consist of refractory metals (Ta, Ti, W), refractory metal nitrides (TaN, TiN, WN), refractory metal alloys (TaSiN), or a combination of these materials. The conductive layer may consist of copper, aluminum, tungsten or silver. In one preferred embodiment of the invention, the conducting metal is copper, and the associated liner consists of a thin layer of tantalum nitride (TaN), followed by a thin layer of tantalum (Ta), and then a copper seed layer. The details of forming the liner 135 are known in the art. A second preferred liner materials consists of a thin layer of titanium nitride (TiN) deposited by a CVD process, followed by a thin layer of tantalum (Ta), and then a copper seed layer. The excess metal 130 and liner 135 are then removed as shown in FIG. 10 by chemical mechanical planarization (CMP). The CMP process removes the third hardmask layer 60 and the second hardmask 50, but does not remove the low dielectric constant first hardmask layer 40. It is important for the first hardmask layer 40 to remain in place to ensure a reliable semiconductor device since the CMP process may damage bulk low-k ILD 30 and degrade its serviceable lifetime. The preferred CMP process is a 2 step process as disclosed in U.S. Pat. No. 5,676,587 issued to Landers, incorporated herein by reference. In this process, metal 130 is removed with a first CMP process, which is selective to liner 135. A second CMP process is used to remove liner 135. The preferred embodiment of the invention further includes a second CMP process that removes liner 135 as well as third hardmask 60 and second hardmask 40, but does not remove first hardmask 40.

Following the CMP process, it is desirable to cap the structure such that conductor 130 and first hardmask 40 are completely covered by a cap material 150 which may serve as an etch stop layer for another interconnect layer to be fabricated above it. Additionally, this layer also serves as a diffusion barrier for the metal 130 to prevent its movement within the interconnect structure. A preferred cap material is a silicon nitride film, with a thickness in the range of about 10–200 nm, preferably about 35 nm. The presence of low-k hardmask 40 above bulk low-k ILD 30 serves to protect the bulk low-k ILD 30 during the deposition of cap layer 150. A second preferred cap material is BLoK™ with a thickness range of about 10–100 nm, preferably about 50 nm. The advantage of BLoK™ being a lower dielectric constant that silicon nitride.

Figure 11:
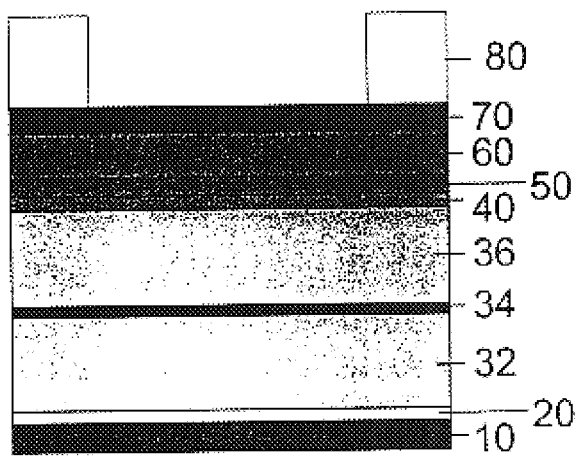
FIGS. 11–12 are cross-sectional view of a semiconductor device illustrating a method of forming interconnect structures in accordance with a second preferred embodiment of the present invention utilizing a dual damascene structure with a triple layer hardmask and an embedded etch stop layer.
Figure 12:
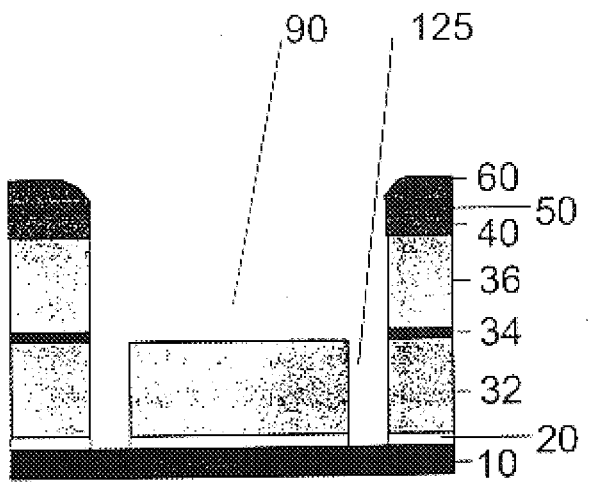

A second preferred embodiment of the present invention comprising a dual damascene structure having a triple layer hardmask and further including an embedded etch stop layer is depicted in FIGS. 11 and 12. In FIG. 11, a structure similar to that shown in FIG. 1 is shown except that the bulk low-k ILD is separated into two sections, a lower ILD 32 having a thickness of about 100–2000 nm, and an upper ILD 36 having a thickness of about 100–2000 nm. The two ILD layers 32 and 36 are separated by an embedded etch stop layer 34 having a thickness of about 10–200 nm. The upper and lower portions of the bulk low-k ILD do not have to be the same material. They can be different materials, and in some cases it is advantageous to use two different materials. For example, to trade off some dielectric constant reduction at the via level for mechanical strength by using a stronger, but higher-k material as the lower ILD.

Embedded etch stop layer 34 is relatively thin compared to the combined thickness of the first and second hardmask layers 40, 50, and is chosen to be etched with the same chemistry used to etch the first and second hardmask layers discussed with respect to FIG. 6. Preferably, the embedded etch stop layer 34 is a PECVD silicon nitride with a thickness of about 15 nm although the embedded etch stop layer 34 may comprise the same materials disclosed above for etch stop layer 20. Another preferred embedded etch stop layer is an OSG SiCOH film deposited from TMCTS with a thickness of about 15 nm. Embedded etch stop layer 34 provides a means for uniform etching of the bulk low-k ILD.

In FIG. 12, the structure is etched in the manner similar to that described in connection with the first embodiment proceeding until via 125 stops on embedded etch stop layer 34. The etch is continued through embedded etch stop layer 34 and etch stop layer 20. With the thickness of ILD 32 greater than the thickness of ILD 36, the via etch must include sufficient over-etch (on line-layer ILD 36) such that via 125 is transferred fully through lower ILD 32 until it reaches etch stop layer 20, while line-level 90 is etched until it reaches embedded etch stop layer 34 and then ceases to etch any further. The etching conditions for etch stop layer 20 described earlier may also be used to etch the embedded etch stop layer 34 to form the structure depicted in FIG. 12.

Figure 13:
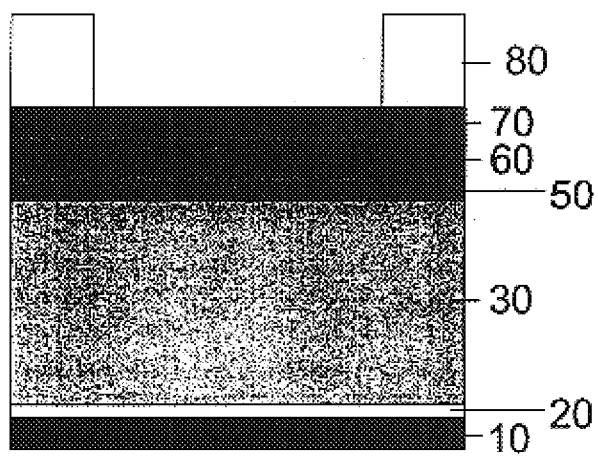
FIG. 13 is a cross-sectional view of a semiconductor device illustrating a method of forming interconnect structures in accordance with a third preferred embodiment of the present invention utilizing a dual damascene structure with a bi-layer hardmask.

A third embodiment of the present invention is depicted in FIG. 13 comprising a dual damascene structure having a bi-layer hardmask. The structure of FIG. 13 is similar to the structure of FIG. 1 except that the first low dielectric constant hardmask layer 40 is omitted. Fabrication proceeds in a manner similar to that described in connection with FIGS. 1–10 except that conditions for the CMP process are chosen such that hardmask layer 60 is removed while leaving hardmask layer 50 permanently in the structure. This structure has many advantages over structures known in the prior art and allows for the use of organic bulk low-k ILD 30 while providing tolerance for overlay errors, lithography rework capability, high performance, low cost and physical construction feasibility. In this embodiment the preferred bi-layer hardmask comprises PECVD silicon nitride with a thickness of about 35 nm (hardmask layer 50) and PECVD silicon dioxide layer with a thickness of about 150 nm (hardmask layer 60).

Figure 14:
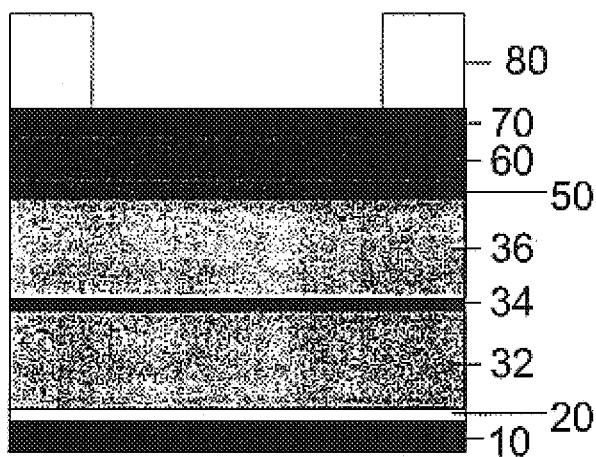
FIG. 14 is a cross-sectional view of a semiconductor device illustrating a method of forming interconnect structures in accordance with a fourth preferred embodiment of the present invention utilizing a dual damascene structure with a bi-layer hardmask and en embedded etch stop layer.

A fourth embodiment is depicted in FIG. 14 comprising a dual damascene structure having a bi-layer hardmask further including an embedded etch stop layer similar to the structure shown in FIGS. 1 and 13. As in FIG. 13, a low dielectric constant hardmask layer 40 is omitted. However, similar to FIG. 11, the bulk low-k ILD is comprised of two sections, a lower ILD 32 and an upper ILD 36 separated by embedded etch stop layer 34. Patterning proceeds identically to that discussed previously except that again hardmask layer 60 is removed while permanently retaining hardmask layer 50 in the final structure.

Figure 15:
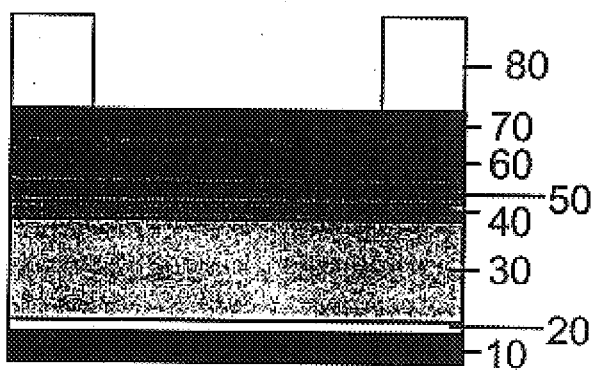
FIGS. 15–16 are cross-sectional views of a semiconductor device illustrating a method of forming interconnect structures in accordance with a fifth preferred embodiment of the present invention utilizing a single damascene structure with a triple layer hardmask.

In a fifth embodiment comprising a single damascene structure with a triple layer hardmask, FIG. 15 illustrates a structure similar to the dual damascene structure of FIG. 1 except that bulk low-k ILD 30 now has a thickness of a desired line-level, and the etch stop layer 20 is optional. A photoresist layer 80 is patterned and etched, the pattern of which is etched into third hardmask layer 60 and anti-reflective coating 70. Again, the conditions of the plasma etch to remove unwanted portions of third hardmask layer 60 and anti-reflective coating 70 are chosen such that the second hardmask layer 50 is not adversely affected. The material of second hardmask layer 50 is chosen such that it is not adversely affected by the photoresist removal process employed after patterning third hardmask layer 60. It should be noted that second hardmask layer 50 protects the first hardmask layer 40 comprising a low-k material from exposure to processes such as the hardmask image transfer which forms image 90 and from the photoresist strip process, both of which may damage the first hardmask layer 40 increasing its dielectric constant in an undesirable fashion.

Figure 16:
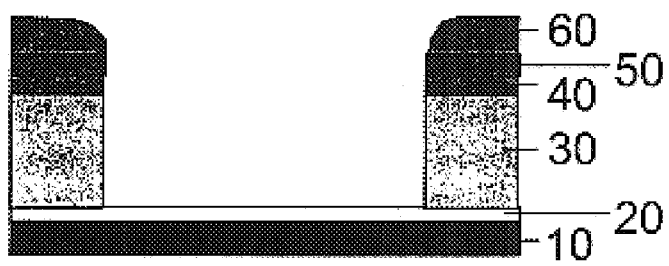

The etching process continues as shown in FIG. 16 wherein the pattern image is transferred to the second hardmask layer 50 and first hardmask layer 40. The pattern is further etched into bulk low-k ILD 30 similar to the method steps of FIG. 7. If the optional etch stop layer 20 is used as in FIG. 8, the etch stop layer would also be etched through but will require a cleaning step. Metallization proceeds as in FIG. 9 followed by CMP to remove excess metal.

Figure 17:
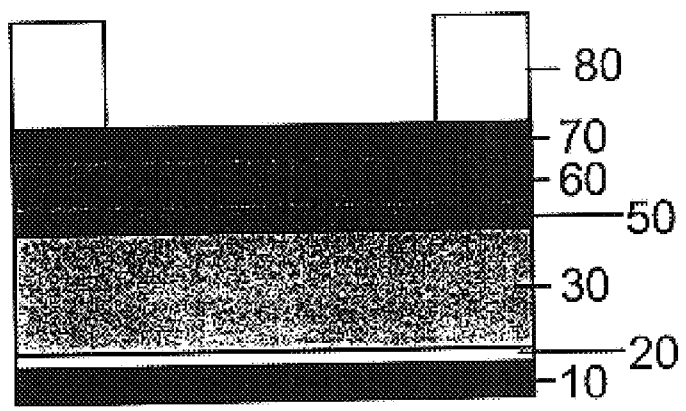
FIG. 17 is a cross-sectional view of a semiconductor device illustrating a method of forming interconnect structures in accordance with a sixth preferred embodiment of the present invention utilizing a single damascene structure with a bi-layer hardmask.

In a sixth embodiment shown in FIG. 17 comprising a single damascene structure having a bi-layer hardmask, the structure has omitted within the lower dielectric constant hardmask layer 40 with or without an etch stop layer 20. Bulk low-k ILD 30 preferably comprising an organic spin-on polymer SiLK™ is deposited over substrate 10 and, if present, etch stop layer 20. Disposed over bulk low-k ILD 30 is first hardmask layer 50 preferably comprising PECVD silicon nitride having a thickness of about 35 nm, a second hardmask layer 60 comprising PECVD silicon dioxide having a thickness of about 150 nm, anti-reflective coating 70, and photoresist 80. The structure is then patterned and etched as described above, filled with metallization and planarized.

Figure 18:
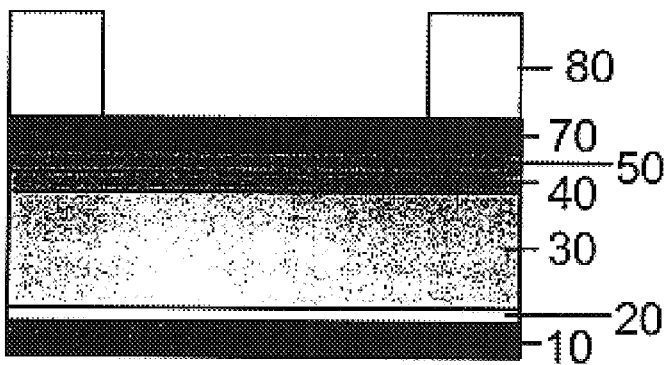
FIGS. 18–20 are cross-sectional views of a semiconductor device illustrating a method of forming interconnect structures in accordance with a seventh preferred embodiment of the present invention is shown a single damascene structure with a bilayer hardmask.
Figure 19:
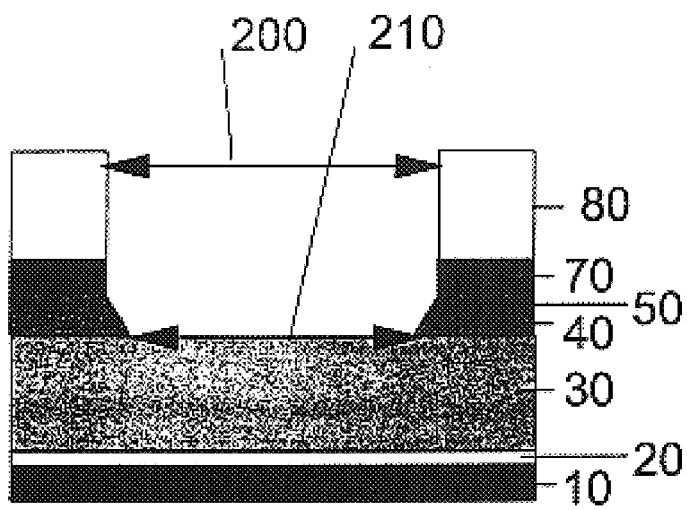
Figure 20:
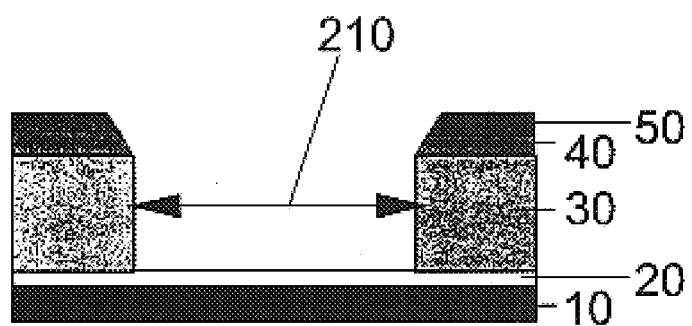

In a seventh embodiment comprising a single damascene structure having a bi-layer hardmask shown in FIG. 18, third hardmask layer 60 is omitted resulting in several improvements in performance. The structure of FIG. 18 comprises substrate 10, with or without etch stop layer 20, bulk low-k ILD 30 preferably comprising an organic spin-on polymer SiLK™, a first hardmask layer 40 comprising an amorphoushydrogenated silicon carbide BLoK™ of about 50 nm or an OSG such as SiCOH deposited from TMCTS of about 50 nn, a second hardmask layer 50 comprising PECVD silicon nitride having a thickness of about 70 nm. The structure is again patterned and etched, filled with metallization and planarized in accordance with the present invention as discussed above. As shown in FIG. 19, the pattern 200 in photoresist layer 80 is first transferred onto anti-reflective coating 70 with a conventional plasma etch process. Subsequently, second hardmask layer 50 and low dielectric constant hardmask layer 40 are etched with a process which etches through both films producing a slope in the hardmask material such that the photoresist pattern size is transferred into the hardmask as a second smaller image 210. Although the method and structure are still valid when the second image 210 is greater than or equal to the first image 200, there is an advantage to having the second image 200 being smaller. Smaller features are less likely to short together causing device failures and increasing the separation between features decreases the capacitive coupling between features. The anti-reflective coating 70 is etched under the following conditions in a model IPS plasma etcher manufactured by Applied Materials Corp.: 0–50 sccm Ar, 0–20 sccm $C_4FE$, 0–100 sccm $CQF_6$, 0–100 sccm $CHF_3$, 0–100 sccm $CF_4$, 0–100 sccm $O_2$, 0–100 sccm $N_2$, 0–100 sccm CO, 0–100 sccm $CO_2$, with an inner source set at 0–1000 Watts, an outer source set at 400–2500 Watts, biased at 0–1400 Watts, at a pressure of 0–100 mTorr. The hardmask layers may also be etched under the same conditions as well.

The second smaller image 210 is transferred from hardmask layers 40, 50 into the bulk low dielectric constant interlevel dielectric 30. Photoresist layer 80 and anti-reflective coating 70 may be removed during the etching of the bulk low-k ILD 30 or as a separate process step. If etch stop layer 20 is present, it must be etched through followed by a cleaning process as discussed above. Metallization and planarization proceed as described with respect to FIG. 9 above. It is important to note that this embodiment provides an integrated process wherein photoresist 80 and the anti-reflective coating materials are desirably removed during the plasma etching of the low dielectric constant interlevel dielectric material.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of protecting a dielectric layer on a semiconductor material during processing of the material, the method comprising:

providing a substrate of a semiconductor material and, optionally, an etch stop layer thereover;

depositing a bulk dielectric material over the semiconductor material;

depositing a first hardmask layer, comprising a material having a dielectric constant of about 2.5–8.0, over the bulk dielectric material;

depositing a sacrificial second hardmask layer disposed over the first hardmask layer;

subsequently processing the semiconductor material, the hardmask layers and the bulk dielectric material to make interconnect structures on the substrate, wherein during said processing the second hardmask layer entirely covers said first hardmask layer thereby protecting the first hardmask layer from processing exposure to substantially avoid both increase of said dielectric constant of the first hardmask layer and damage thereof;

removing the second hardmask layer after the interconnect structures are made, while permanently retaining the first hardmask layer over the bulk dielectric material; and further processing the semiconductor material, the first hardmask layer and the bulk dielectric material to form completed interconnect structures, wherein the first hardmask layer material protects the bulk dielectric material to substantially prevent alteration of the dielectric constant thereof during said steps of subsequent processing and further processing.

2. The method of claim 1 wherein the step of depositing a first hardmask layer comprises depositing a material having a dielectric constant of 2.5–4.5.

3. The method of claim 1 wherein the step of depositing the first and second hardmask layers comprises depositing at least one of silicon nitride, silicon carbide, amorphous hydrogenated silicon carbide, silicon carbide nitride, organo-silicate glass, silicon rich oxide, silicon dioxide, tetraethylorthosilicate, phosphosilicate glass, organic siloxane polymer, carbon doped silicate glass, hydrogen doped silicate glass, silsesquioxane glass, spin-on glass, and fluorinated silicate glass.

4. The method of claim 1 wherein the step of depositing a first hardmask layer comprises depositing a first hardmask layer having a thickness of about 10–200 nm.

5. The method of claim 1 further including the step of depositing a sacrificial third hardmask layer over the sacrificial second hardmask layer, the third hardmask layer being removed during subsequent processing.

6. The method of claim 1 wherein the step of subsequent processing to make interconnect structures comprises forming openings in the hardmask layers and in the bulk dielectric material and filling such openings with a metal to make electrically conductive connections from the substrate to a region above the first hardmask layer.

7. The method of claim 6 further including the step of chemical mechanical polishing to remove excess metal within the interconnect structures wherein the bulk dielectric material is protected from an undesirable increase in its dielectric constant, an undesirable increase in leakage, and yield reduction due to scratching by the first hardmask layer.

8. The method of claim 1 wherein the steps of depositing the first and second hardmask layers comprise a single deposition utilizing one precursor material and altering deposition conditions to provide two films with different dielectric constants.

9. The method of claim 1 wherein during the step of subsequent processing of the semiconductor material, the upper surface of the bulk dielectric material is unexposed.

10. The method of claim 1 further including the step of providing an embedded etch stop layer within the bulk dielectric material separating the bulk dielectric material into a lower portion and an upper portion.

11. The method of claim 10 wherein in the step of providing an embedded etch stop layer within the bulk dielectric material, the bulk dielectric material comprises a lower portion having a different composition than an upper portion.

12. A method of forming interconnect structures comprising the steps of:

providing a semiconductor substrate;

depositing a bulk dielectric material over the semiconductor substrate;

depositing a first hardmask layer having a dielectric constant substantially equal to a dielectric constant of the bulk dielectric material;

depositing a second hardmask layer over the first hardmask layer;

depositing a third hardmask layer over the second hardmask layer;

etching one or more vias through the hardmask layers and the bulk dielectric material, wherein during said etching the second hardmask layer entirely covers said first hardmask layer thereby protecting the first hardmask layer from processing exposure to substantially avoid both increase of said dielectric constant of the first hardmask layer and damage thereof;

depositing a conductive material into the vias; and removing an excess of the conductive material by chemical mechanical planarization wherein the third and second hardmask layers are simultaneously removed, while the first hardmask layer is retained over the bulk dielectric material to protect said bulk dielectric material and substantially prevent alteration of said dielectric constant thereof during said steps of etching said vias and removing said material and layers.

13. The method of claim 12 further including the step of providing an etch stop layer between the semiconductor substrate and the bulk dielectric material and further including the steps of etching through the etch stop layer when etching one or more vias and cleaning the vias prior to depositing the conductive material into the vias.

14. The method of claim 12 further including the step of providing an embedded etch stop layer within the bulk dielectric material thereby dividing the bulk dielectric material into a lower portion and an upper portion.

15. The method of claim 14 wherein in the step of providing an embedded etch stop layer within the bulk dielectric material, the bulk dielectric material comprises a lower portion having a different composition than an upper portion.

16. The method of claim 14 wherein the step of providing an embedded etch stop layer within the bulk dielectric material comprises dividing the bulk dielectric into a lower portion and an upper portion, the upper portion being thicker than the lower portion, wherein the step of etching one or more vias includes etching one or more vias in the upper portion of the bulk dielectric material to the embedded etch stop layer, removing a portion of the embedded etch stop layer, and etching the lower portion of the bulk dielectric material.

17. The method of claim 12 further including the step of depositing a diffusion barrier material into the vias prior to the step of depositing a conductive material into the vias.

18. The method of claim 12 wherein the steps of depositing the first, second and third hardmask layers occur in a single deposition step such that a single precursor is used while changing deposition conditions to alter a dielectric constant of the hardmask layers.

19. The method of claim 12 further including the step of etching one or more lines through the hardmask layers and into the bulk dielectric material.

20. A method of forming an interconnect structure comprising:

providing a semiconductor substrate;

depositing a bulk dielectric material over the semiconductor substrate;

depositing a first, permanent hardmask layer having a dielectric constant substantially equal to a dielectric constant of the bulk dielectric material;

depositing at least a second hardmask layer over the first hardmask layer;

depositing and imaging at least a first photoresist layer over said structure;

processing said structure to form at least one via through the hardmask layers and the bulk dielectric material by transferring said at least first photoresist image and etching said hardmask layers and bulk dielectric material, wherein during said processing steps said at least second hardmask layer entirely covers said first hardmask layer thereby protecting the first hardmask layer from said processing exposure to substantially avoid both an increase of said dielectric constant of said first hardmask layer and damage thereof;

depositing a conductive material into the vias; and removing an excess of the conductive material by chemical mechanical planarization while simultaneously removing said at least second hardmask, whereby the first hardmask layer is retained over the bulk dielectric material to protect said bulk dielectric material and substantially prevent alteration of said dielectric constant thereof during said steps of etching said vias and removing said layers by chemical mechanical planarization.

21. The method of claim 20 wherein the steps of depositing the first and at least second hardmask layers comprise a single deposition utilizing one precursor material and altering deposition conditions to provide said films with different dielectric constants.

22. The method of claim 20 further including the step of providing an embedded etch stop layer within the bulk dielectric material separating the bulk dielectric material into a lower portion and an upper portion.

23. The method of claim 20 further including the step of providing an etch stop layer between the semiconductor substrate and the bulk dielectric material and further including the steps of etching through the etch stop layer when etching one or more vias and cleaning the vias prior to depositing the conductive material into the vias.

24. The method of claim 20 further including depositing a third hard mask layer over said second hard mask layer and removing said third and second hardmask layers while removing said excess conductive material.

25. The method of claim 20 further including the step of depositing a diffusion barrier material into the vias prior to the step of depositing a conductive material into the vias.

26. The method of claim 20 further including following the chemical mechanical planarization process depositing a cap layer over said structure to completely cover said conductive material and said first hardmask layer.

27. The method of claim 26 wherein said cap layer serves as an etch stop layer for formation of another interconnect layer above said cap layer.

28. A method of forming a dual damascene interconnect structure comprising:

providing a semiconductor substrate;

depositing a bulk dielectric material over the semiconductor substrate;

depositing a first hardmask layer having a dielectric constant substantially equal to a dielectric constant of the bulk dielectric material, said first hardmask layer comprising a permanent hardmask layer;

depositing a second hardmask layer over the first hardmask layer;

depositing a third hardmask layer over the second hardmask layer;

depositing and imaging a first photoresist layer over said third hardmask layer to expose portions thereof;

processing said structure by transferring said image into said exposed portions of said third hardmask layer for etching thereof to expose underlying portions of said second hardmask layer and subsequently removing any remaining photoresist layer, whereby said second hardmask layer protects said first hardmask layer from exposure to said processing steps to substantially avoid increase of said dielectric constant thereof;

depositing and imaging a second photoresist layer over said structure;

further processing said structure to form at least one via through the hardmask layers and the bulk dielectric material by transferring said second photoresist image into and etching said hardmask layers and bulk dielectric material wherein during said etching said second hardmask layer entirely covers said first hardmask layer thereby protecting the first hardmask layer from said further processing exposure thereby substantially avoiding both an increase of said dielectric constant of said first hardmask layer and damage thereof;

depositing a conductive material into the vias;

removing an excess of the conductive material by chemical mechanical planarization wherein the third and second hardmask layers are simultaneously removed, while the first hardmask layer is retained over the bulk dielectric material to protect said bulk dielectric material and substantially prevent alteration of said dielectric constant thereof during said steps of etching said vias and removing said material and layers by chemical mechanical planarization; and depositing a cap layer over said structure to completely cover said conductive material and said first hardmask layer, said first hardmask layer protecting said bulk dielectric material during depositing of said cap layer.

29. The method of claim 28 wherein said cap layer serves as an etch stop layer for formation of another interconnect layer above said cap layer.

* * * * *